(12) United States Patent
Kumar et al.

(10) Patent No.: US 7,394,683 B2
(45) Date of Patent: *Jul. 1, 2008

(54) SOLID STATE MAGNETIC MEMORY SYSTEM AND METHOD

(75) Inventors: Santosh Kumar, San Jose, CA (US); Subodh Kumar, Glen Allen, VA (US); Divyanshu Verma, Glen Allen, VA (US); Krishnakumar Mani, San Jose, CA (US)

(73) Assignee: MagSil Corporation, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/985,472

(22) Filed: Nov. 10, 2004

(65) Prior Publication Data

US 2006/0098479 A1    May 11, 2006

Related U.S. Application Data

(60) Provisional application No. 60/518,098, filed on Nov. 7, 2003.

(51) Int. Cl.
*G11C 11/02*    (2006.01)
(52) U.S. Cl. .................................... 365/158; 365/225.5
(58) Field of Classification Search .................. 365/158
See application file for complete search history.

(56) References Cited

U.S. PATENT DOCUMENTS

| | | | |
|---|---|---|---|
| 5,587,943 A * | 12/1996 | Torok et al. .................. 365/158 |
| 6,266,267 B1 * | 7/2001 | Lienau ........................ 365/145 |
| 6,391,483 B1 * | 5/2002 | Zhu et al. .................... 428/810 |
| 6,462,980 B2 * | 10/2002 | Schuster-Woldan et al. . 365/158 |
| 6,829,162 B2 * | 12/2004 | Hosotani ..................... 365/173 |
| 7,023,724 B2 * | 4/2006 | Katti .......................... 365/158 |
| 7,038,939 B2 * | 5/2006 | Amano et al. ............... 365/158 |
| 7,067,866 B2 * | 6/2006 | Shi ............................ 257/296 |
| 7,088,612 B2 * | 8/2006 | Braun et al. ................. 365/173 |
| 7,092,284 B2 * | 8/2006 | Braun et al. ................. 365/158 |
| 7,110,312 B2 * | 9/2006 | Stephenson et al. ......... 365/209 |
| 7,200,032 B2 * | 4/2007 | Braun et al. ................. 365/158 |
| 7,239,570 B2 * | 7/2007 | Kumar et al. ............. 365/225.5 |
| 2007/0058422 A1 * | 3/2007 | Phillips et al. .............. 365/158 |
| 2007/0081381 A1 * | 4/2007 | Lenssen ..................... 365/158 |

OTHER PUBLICATIONS

"Electrically Alterable Read-Only Memory Array" (NN820641), Jun. 1, 1982, IBM Technical Disclosure Bulletin, vol. 25, Issue 1, pp. 41-43.*

* cited by examiner

*Primary Examiner*—Amir Zarabian
*Assistant Examiner*—Michael Weinberg
(74) *Attorney, Agent, or Firm*—James E. Eakin

(57) ABSTRACT

A solid state magnetic memory system and method disposes an array of magnetic media cells in an array on a substrate. In an exemplary embodiment, drive electronics are fabricated into the substrate through conventional CMOS processing in alignment with associated cells of the array. The magnetic media cells each include a magnetic media bit and a magnetoresistive or GMR stack for reading the state of the media bit. Addressing lines are juxtaposed with the media bits to permit programming and erasing of selected ones of the bits. In at least some embodiments, sector erase may be performed.

13 Claims, 19 Drawing Sheets

Figure 1 – Prior Art

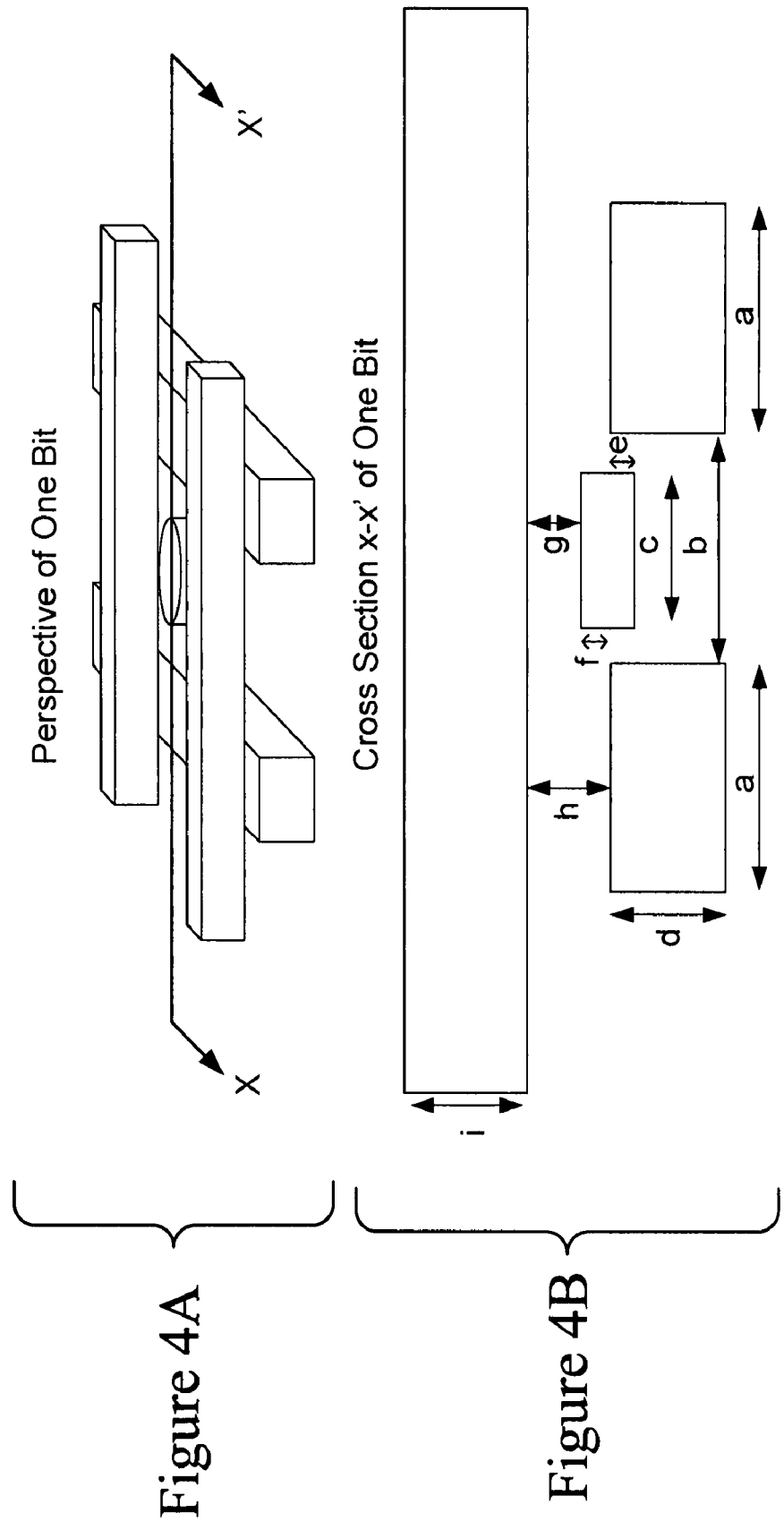
Figure 4A — SMR Data Bit Design, Perspective of One Bit
Figure 4B — Cross Section x-x' of One Bit Cell Layout Impedance Modeling

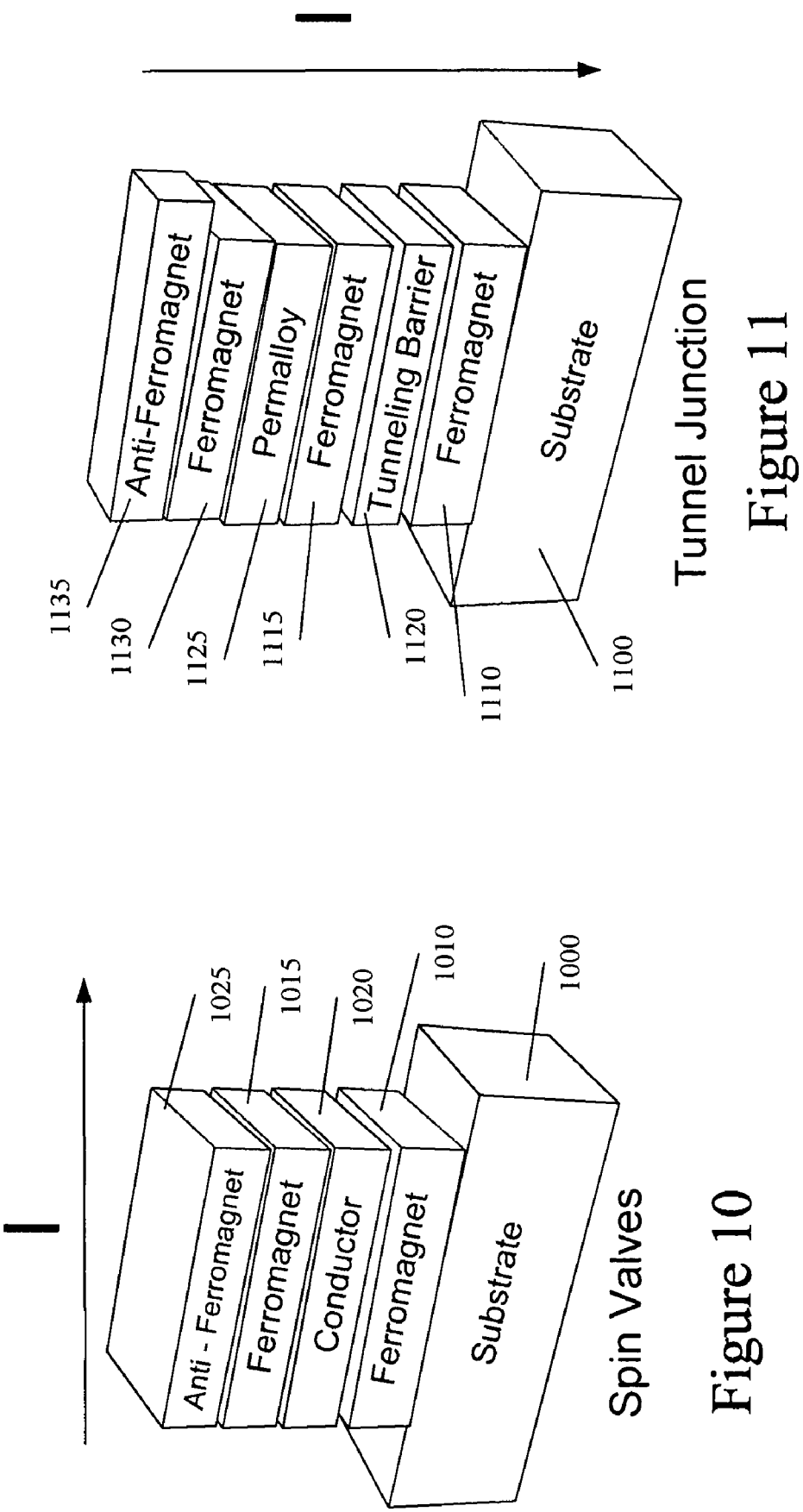

SOLID STATE MAGNETIC MEMORY SYSTEM AND METHOD

RELATED APPLICATIONS

The present application is related to and claims the benefit of U.S. Provisional Patent Application Ser. No. 60/518,098, filed Nov. 10, 2003, which is incorporated herein by reference in full.

FIELD OF THE INVENTION

The present invention relates to solid state memories, and more particularly relates to solid state magnetic memory devices, methods and systems which use magnetic junction tunneling or spin valve effects.

BACKGROUND OF THE INVENTION

In the early days of modern computing, magnetic memory was traditionally associated with core memory. Core memory was quickly made obsolete by the advent of semiconductor memory. As a result, more recently magnetic memory has been almost exclusively associated with disk drives. In a disk drive, a platter coated with a magnetic material rotates in proximity to one or more heads. Depending on the electrical signals applied to the heads, the heads function to write to or read from the disk by affecting, or sensing, respectively, the alignment of a portion of the magnetic material on the platter. While this has served many applications well for an extended period, the moving parts and mechanical aspects of disk drives limit their desirability in many applications which may involve impacts or other stresses which might damage the relatively delicate disk drive.

More recently, solid state magnetic devices have been developed which take advantage of the GMR, or giant magnetoresistive, effect. An example of a structure in which the GMR effect may be observed consists of a stack of four magnetic thin films: a free magnetic layer, a nonmagnetic conducting layer, a magnetic pinned layer, and an exchange layer. Magnetic orientation of the pinned layer is fixed and is held in place by the exchange layer. By applying an external magnetic field, the magnetic orientation of the free layer may be changed with respect to the magnetic orientation of the pinned layer, such that two states can exist. These states can therefore represent two logical values. The change in magnetic orientation results in a significant change in the resistance of the metallic layered structure, and that resistance can be sensed to indicate the stored logical value.

The GMR effect has been used in what are referred to as MRAM, or Magnetoresistive Random Access Memory devices. These devices offer some tantalizing benefits over disk drives, because they do not involve any moving parts. A typical MRAM structure is shown in FIG. 1, in which two layers of ferromagnetic material are separated by a thin insulation layer to form a magnetic tunnel junction. The direction of the domains in the bottom layer is fixed, while those in the top layer can switch when a magnetic field is applied. Whether a 1 or 0 is stored depends on whether the two layers' magnetic domains point in the same or opposite directions.

Writing data into the MRAM cell involves applying current to the bit and digit lines. The magnetic fields created by the two currents line up the magnetic domains in the desired direction. In the case of FIG. 1, current from left to right in the bit line 10 and into the page in the digit line 15 align the free ferromagnetic layer 20 in the same direction as the fixed layer 25. An insulator 30 is positioned between the free layer 20 and the fixed layer 25. The directions of the free and fixed layers are as shown by the arrows on the respective layers, although the orientation of the fixed layer could be in either direction. It will be appreciated by those skilled in the art that the layers 20, 25 and 30 form a magnetic tunnel junction.

Reading the cell involves measuring the resistance of the tunnel junction. It is low if the domains in the two layers are parallel, high if they are antiparallel.

In a typical MRAM structure, a low coercivity ferromagnetic material is used for writing, and a GMR stack is used for both reading and writing to the cell. Further, the GMR stack is typically in contact with the metal lines used to provide drive signals, and at least one drive transistor per cell is required. Unfortunately, these characteristics of MRAM devices present some significant challenges to their broad adoption.

For example, one of the challenges involved in the integration of MRAM technology is temperature incompatibility with the CMOS process. Several standard CMOS process steps occur at or above 400° C. However, the magnetoresistive (MR) effect of typical Magnetic Tunnel Junction (MTJ) material begins to degrade at temperatures above 300° C. and drops sharply by 400° C. Producing MRAMs using MTJs is a key process challenge since the tunneling dielectric is just about 1.5 nm thick. As a result, the lack of compatibility between the magnetic materials used in MRAM and the temperature management required for CMOS processing makes it difficult to integrate MRAM into existing CMOS processes.

Another limitation of conventional MRAM devices is that the erase process is relatively slow and inefficient. In an MRAM device, the erase process is essentially the reverse of the write process; that is, in order to program an MRAM memory bit, current is passed through the conductive lines in one direction. To erase that MRAM memory bit, current is passed through the same conductive lines in the opposite direction. This essentially limits each erase step to a small sector size, which is undesirable because it is slow and inefficient.

As a result there has been a need for a solid state magnetic memory device which is compatible with CMOS processes. In addition, there has been a need for a solid state magnetic memory device which offers a large difference in the resistance between the parallel and antiparallel states of the memory cell.

SUMMARY OF THE INVENTION

The present invention provides a solid state, random access, non-volatile magnetic memory device capable of being integrated with drive electronics in a manner which is compatible with conventional CMOS process. Importantly, the present invention includes no moving parts, has virtually no latency, and can be scaled as desired for many imbedded and discrete applications.

The present invention provides a magnetic solid state memory device having separate stacks for writing and reading, and in which only the read function relies on the GMR effect. In addition, in an exemplary implementation of the current invention, the recording bit is not in contact with the metal lines, and each cell does not require a dedicated transistor associated therewith. In addition, significantly higher coercivity ferromagnetic material may be used for writing in a typical implementation.

Still further, one embodiment of the present invention provides a CMOS/magnetic structure in which the drive electronics are implemented in a substrate below the magnetic portion of the system, which takes advantage of the GMR effect. In another embodiment, the drive circuitry is also magnetic.

Further, in at least some implementations of the invention, a block erase feature is provided in which entire sections of memory cells may be erased simultaneously, thus greatly increasing efficiency.

These and other features of the invention will be better understood from the following detailed description of the invention, taken together with the attached Figures.

THE FIGURES

FIG. 1 [PRIOR ART] illustrates in perspective view a conventional MRAM cell.

FIG. 4A illustrates in perspective view a simplified form of a single bit in accordance with the present invention.

FIG. 4B illustrates in cross-sectional side view a simplified form of a single bit in accordance with the present invention.

FIG. 10 illustrates a first form of read/write head for use with the present invention.

FIG. 11 illustrates a second form of read/write head for use with the present invention.

DETAILED DESCRIPTION OF THE INVENTION

Figure 1:
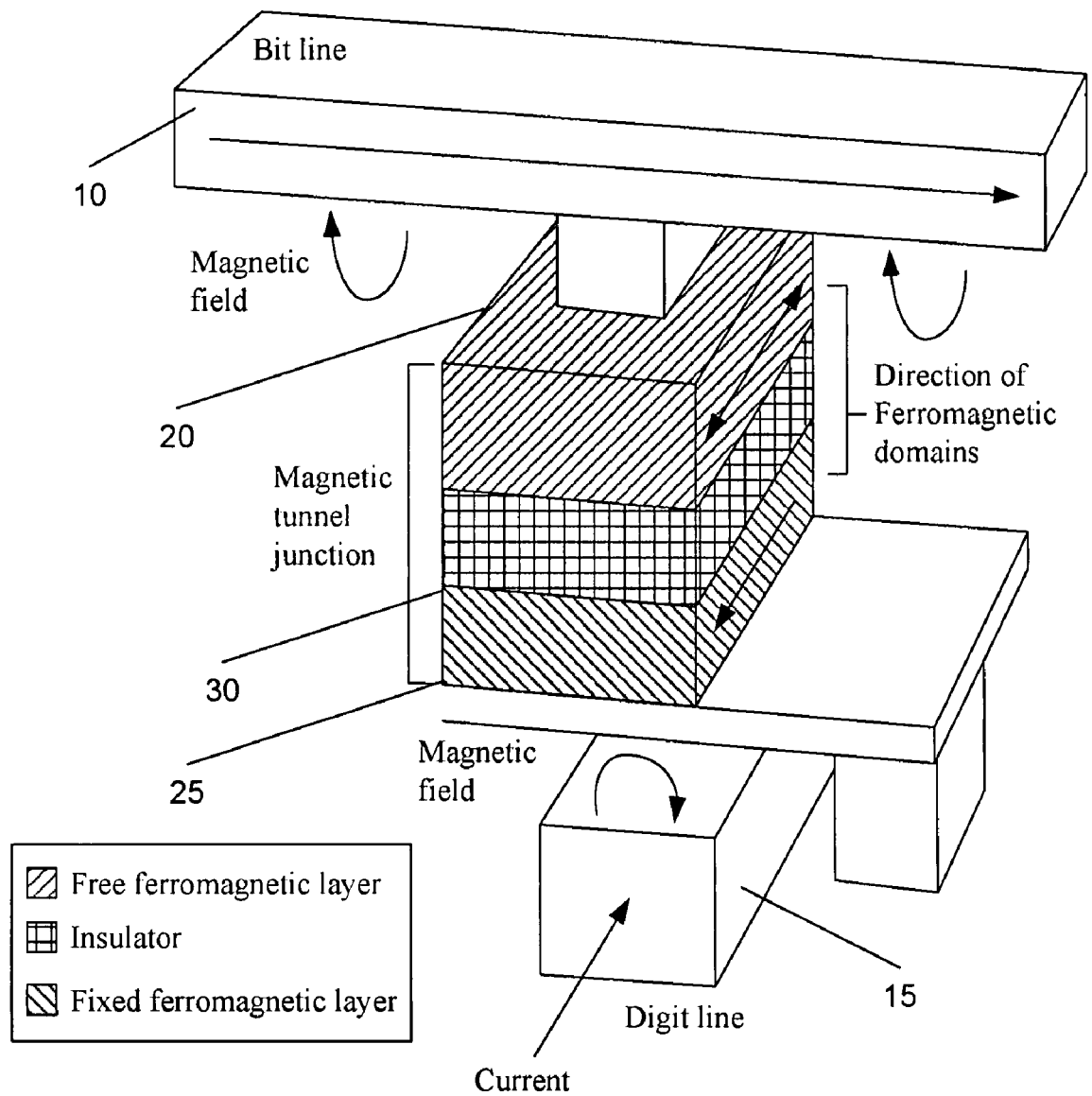
Figure 2:
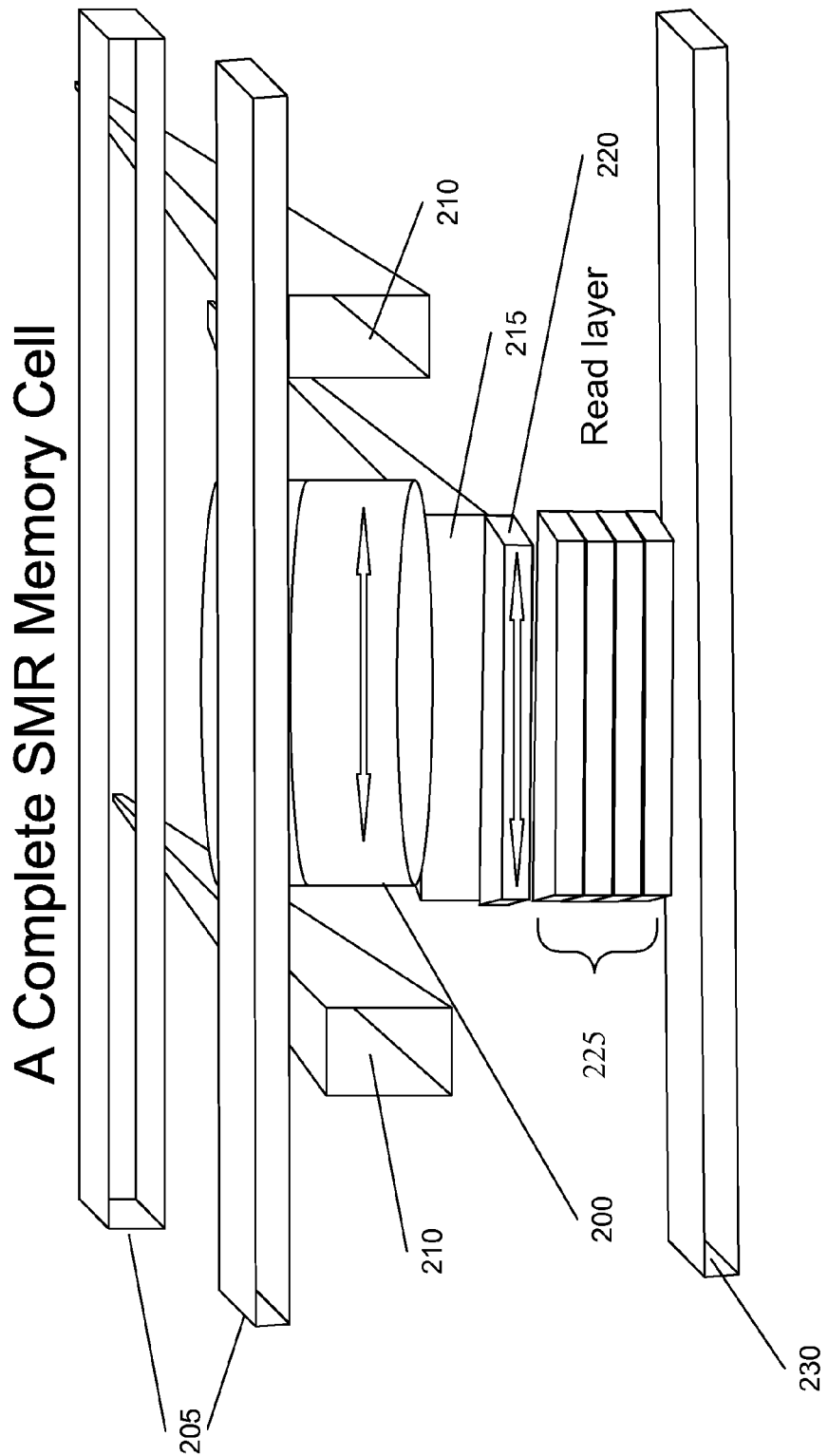
FIG. 2 illustrates in perspective view an exemplary arrangement of a single memory cell in accordance with the present invention.

Referring next to FIG. 2, a memory cell in accordance with the present invention can be better appreciated. A magnetic media recording bit 200 is positioned within a pair of row lines 205 and column lines 210 used for programming and erasing. A thin metallic spacer 215 is positioned beneath the recording bit 200. In an exemplary arrangement, the spacer 215 is comprised of Co/Cu/Co, and is on the order of 1.5 nm thick. A magnetic layer 220 is positioned beneath the spacer 215. Below the magnetic layer 220 is a GMR stack 225 which may also be thought of as a read layer. In an exemplary arrangement of the present invention, the GMR stack is used only for the read function, although other arrangements in which the GMR stack functions to achieve both write and read are also possible. The GMR stack may take any acceptable form, such as either a spin valve and or a magnetic tunnel junction, each of which is more completely illustrated in FIGS. 10 and 11, respectively. Positioned below the GMR stack 225 is a conductive line 230, typically of copper, which serves to connect the GMR stack to the remainder of the array. The entire structure rests upon a substrate into which the copper line 230 is integrated in a conventional manner. It will thus be appreciated that the memory cell of the present invention is positioned in an inverted arrangement, wherein the write and erase lines are positioned above the media bit, and the read head is positioned below the media bit. This arrangement has the benefit of being able to be fabricated in processes which are compatible with conventional CMOS processing, and thus the drive electronics may be fabricated in the substrate before the magnetic features are added.

The media bit 200 typically is arranged in arrays of discrete, lithographically patterned magnetic elements, where each media bit stores one data bit. Each of the data bits is, typically, exchangely isolated from the other bits. However, without each media bit, the polycrystalline magnetic grains are strongly exchange coupled, and in at least some respects behave essentially like a larger single magnetic grain. The material used for the media bits typically have only a single domain, and can be made of polycrystalline materials as well as single crystal or amorphous materials. The magnetic elements have only a single access of polarization, where the direction of that polarization is assigned a "1" or a "zero". Depending on the magnetic properties of the media bit materials, the minimum volume of each discrete magnetic element could be as small as a few nanometers in dimension. The minimum volume is determined primarily by the super paramagnetic limit, but the media bits typically have high anisotropy energy.

Figure 3:
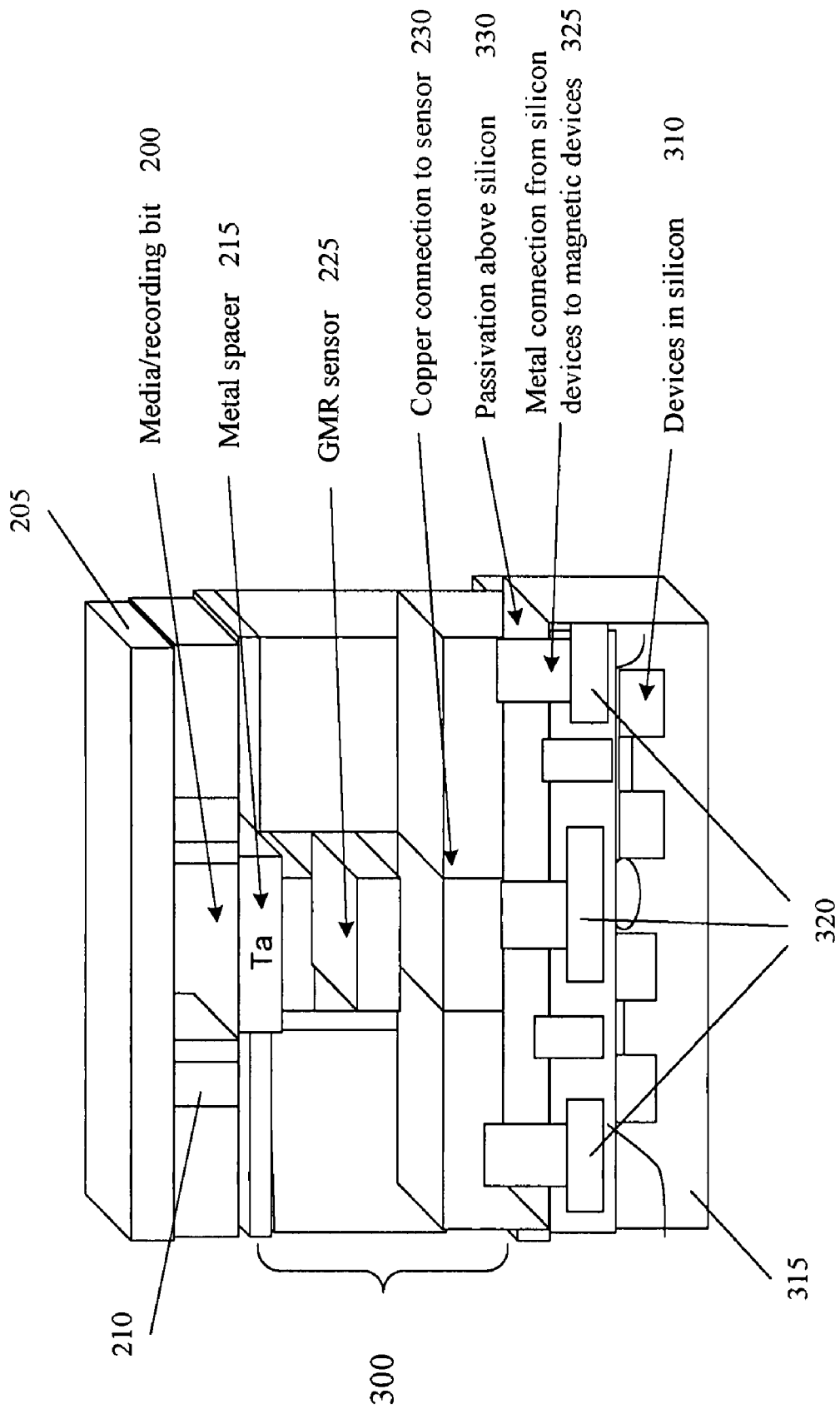
FIG. 3 illustrates a view of the exemplary arrangement of FIG. 1 but also including a representation of the electronic drive circuitry fabricated into the substrate with conventional CMOS or other processing.

Such an arrangement can be appreciated from FIG. 3, in which the memory cell of FIG. 2 is depicted in cross-sectional perspective view above a substrate in which appropriate drive electronics have been fabricated. For the sake of clarity, elements which are the same in FIGS. 2 and 3 have been indicated with like reference numerals. Thus, media bit 200 down through conductive line 230 are the same as in FIG. 2, although appropriate layers of silicon and insulator, referenced generally as 300, are shown in their appropriate positions around the individually identified elements. The process flow, and therefore the composition of each of the layers, will be discussed in greater detail hereinafter in connection with FIGS. 9A-9T. A plurality of devices, which serve as the drive logic, are shown at 310 and are explained in greater detail in connection with FIGS. 6A-6B. The devices 310 are fabricated in a conventional substrate 315, typically through conventional CMOS processing. Appropriate conductive lines for interconnecting the devices 310 are shown at 320. The conductive lines 320 connect to the magnetic portion by means of vias 325 through a passivation layer 330.

Figure 4C:
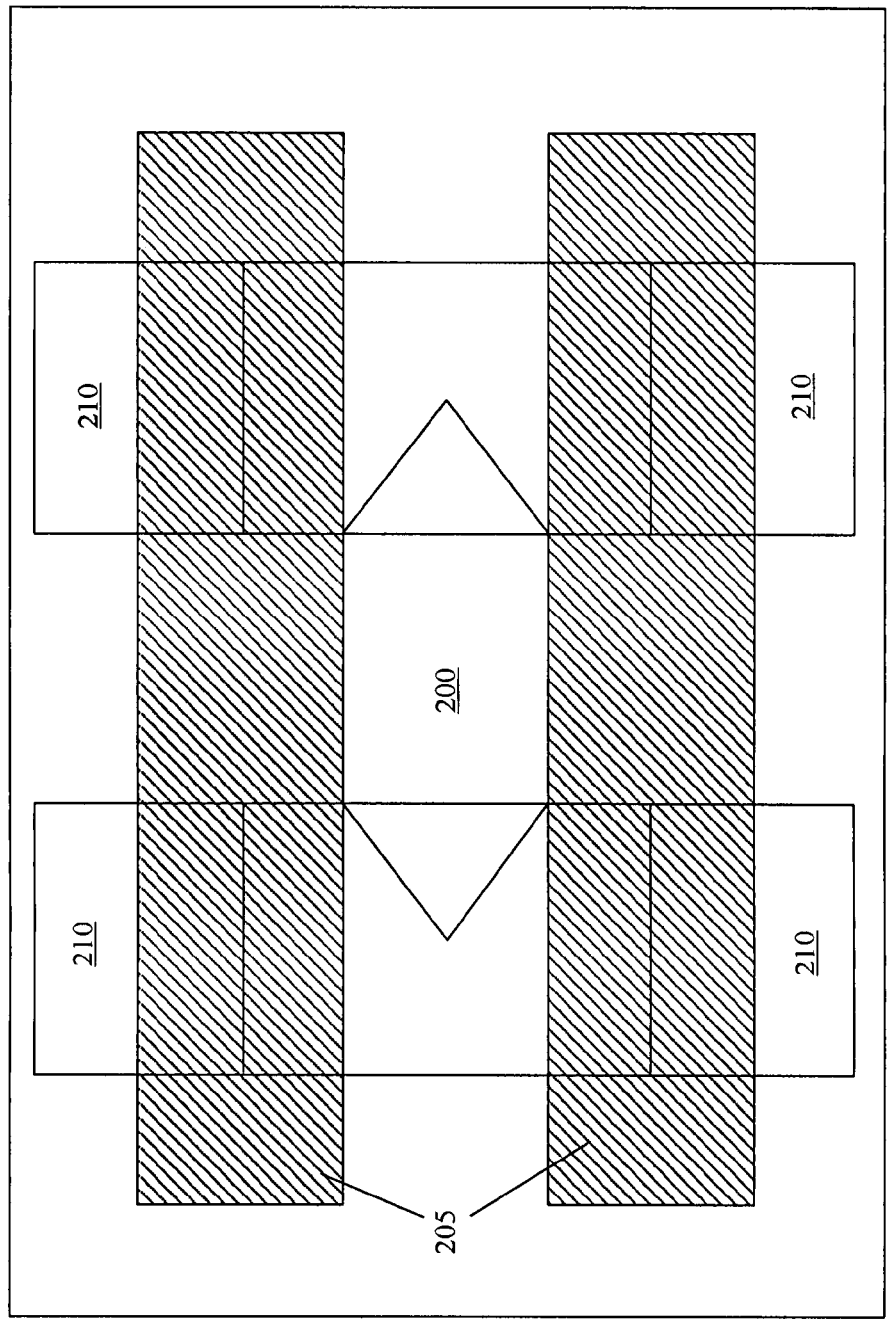
FIG. 4C illustrates in top plan view a simplified representation of a single bit and associated programming/erase lines.

Referring next to FIGS. 4A, 4B and 4C which illustrate respectively a perspective view, a cross-sectional view and a top plan view of a single bit, exemplary dimensions may be better appreciated. As before, like elements are shown with the same reference numerals as in FIG. 2. As best seen in the arrangement of FIG. 4B, nominal dimensions are on the order of the following, with the understanding that dimensions a, b and c may vary on the mask, while dimensions d through i may vary on the wafer:

| | |
|---|---|
| a = | 200 nm |
| b = | 200 nm |
| c = | 200 nm |
| d = | 450 nm |
| e = | ~30 nm |

-continued

| | |
|---|---|
| f = | ~30 nm |
| g = | 170 nm |
| h = | 200 nm |
| i = | 450 nm |

Figure 5A:
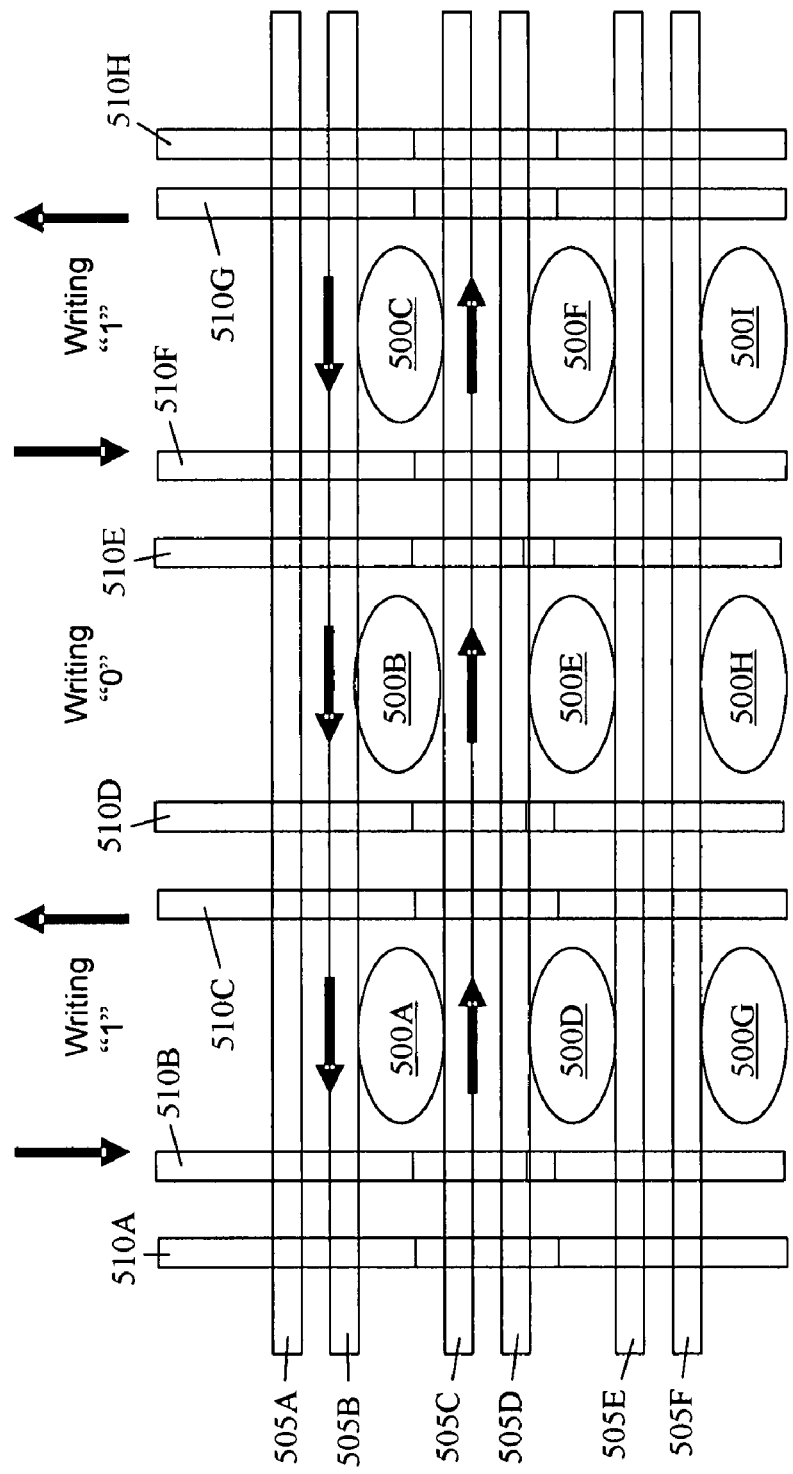
FIGS. 5A-5D illustrate in simplified schematic form write and erase operations in accordance with the present invention, including a block erase arrangement best shown in FIG. 5D.
Figure 5B:
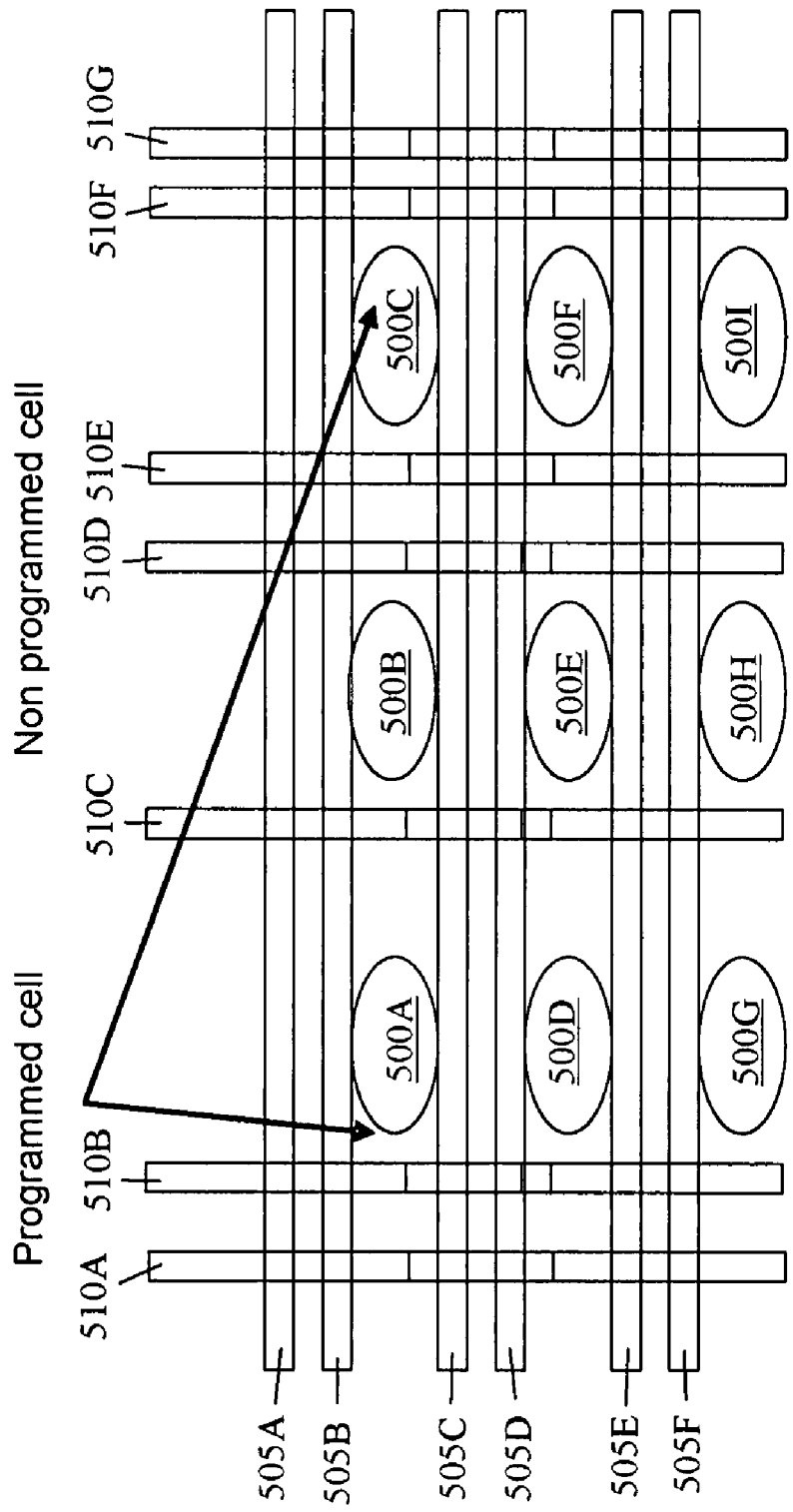

Referring next to FIGS. 5A-5D, the write and erase operation for an array of memory cells in accordance with the present invention may be better appreciated. In particular, FIG. 5A depicts, for purposes of illustration only, a 3×3 array of memory cells each of which has at its center a media bit 500, illustrated individually as 500A-I. It will be understood that the actual array will typically be much larger than 3×3, and may in fact be in the millions or orders of magnitude larger. Addressing lines are, in the example shown, arranged in rows and columns, although other topologies may be acceptable in appropriate instances. Row lines 505A-F and column lines 510A-H are positioned substantially around the media bits, and, taken together with appropriate logic discussed hereinafter in connection with FIGS. 6A-6B, provide program/write and erase functions. More specifically, referring to FIGS. 5A-5B, a "1" may be written to media bits 500A and 500C by applying opposing polarity current drives, as indicated by the opposing arrows, to row lines 505B and 505C, and [for media bit 500A] column lines 510B and 510C, and [for media bit 500C] column lines 510F and 510G. Because no write currents were applied to lines 510D and 510E, media bit 500B is not changed, and remains a zero. The results of the write operation, which is sometimes referred to herein as "programming" a cell, can be seen in FIG. 5B, with media bits 500A and 500C showing a change of state, while the remaining media bits do not.

Figure 5C:
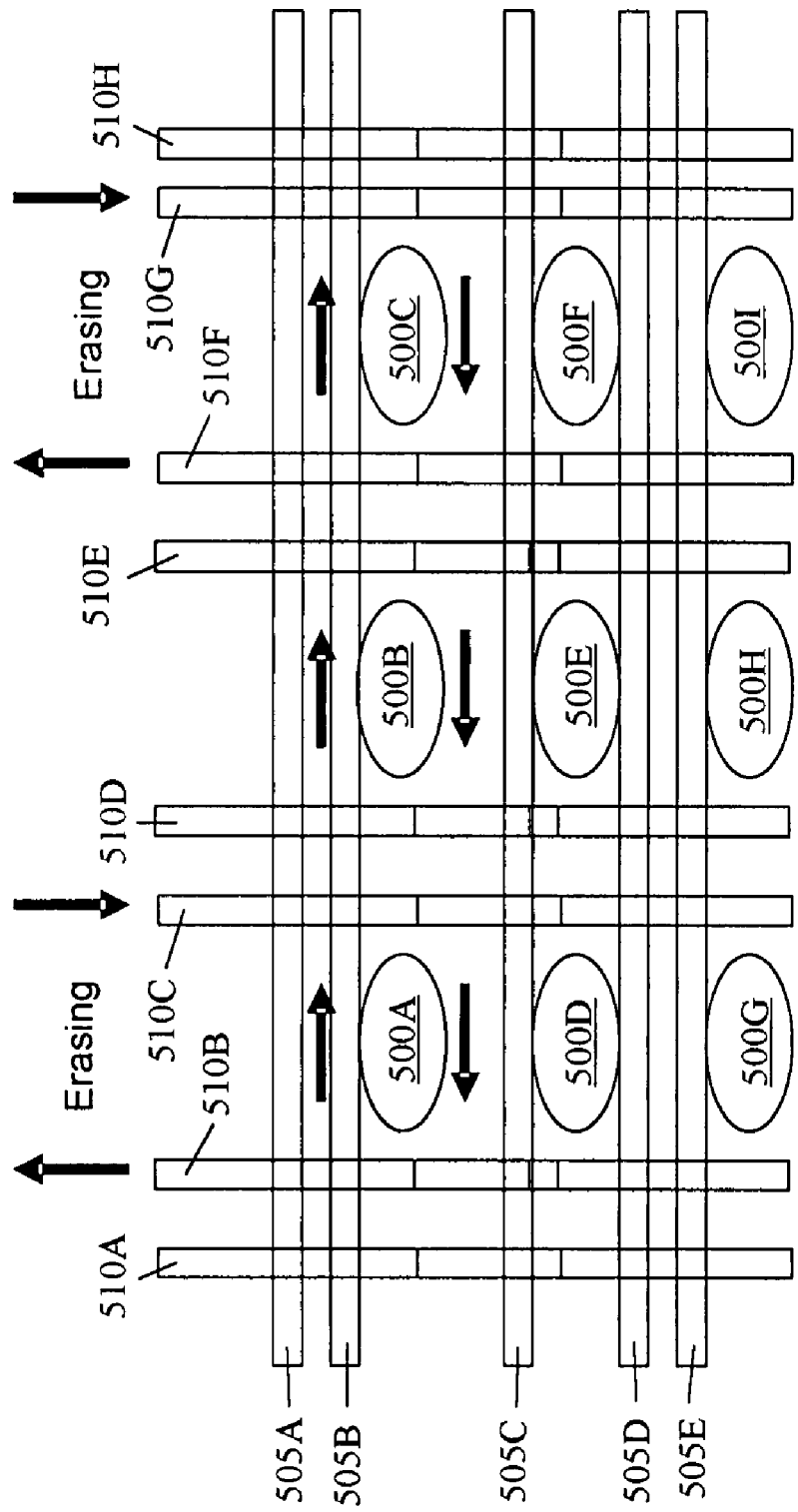
Figure 6A:
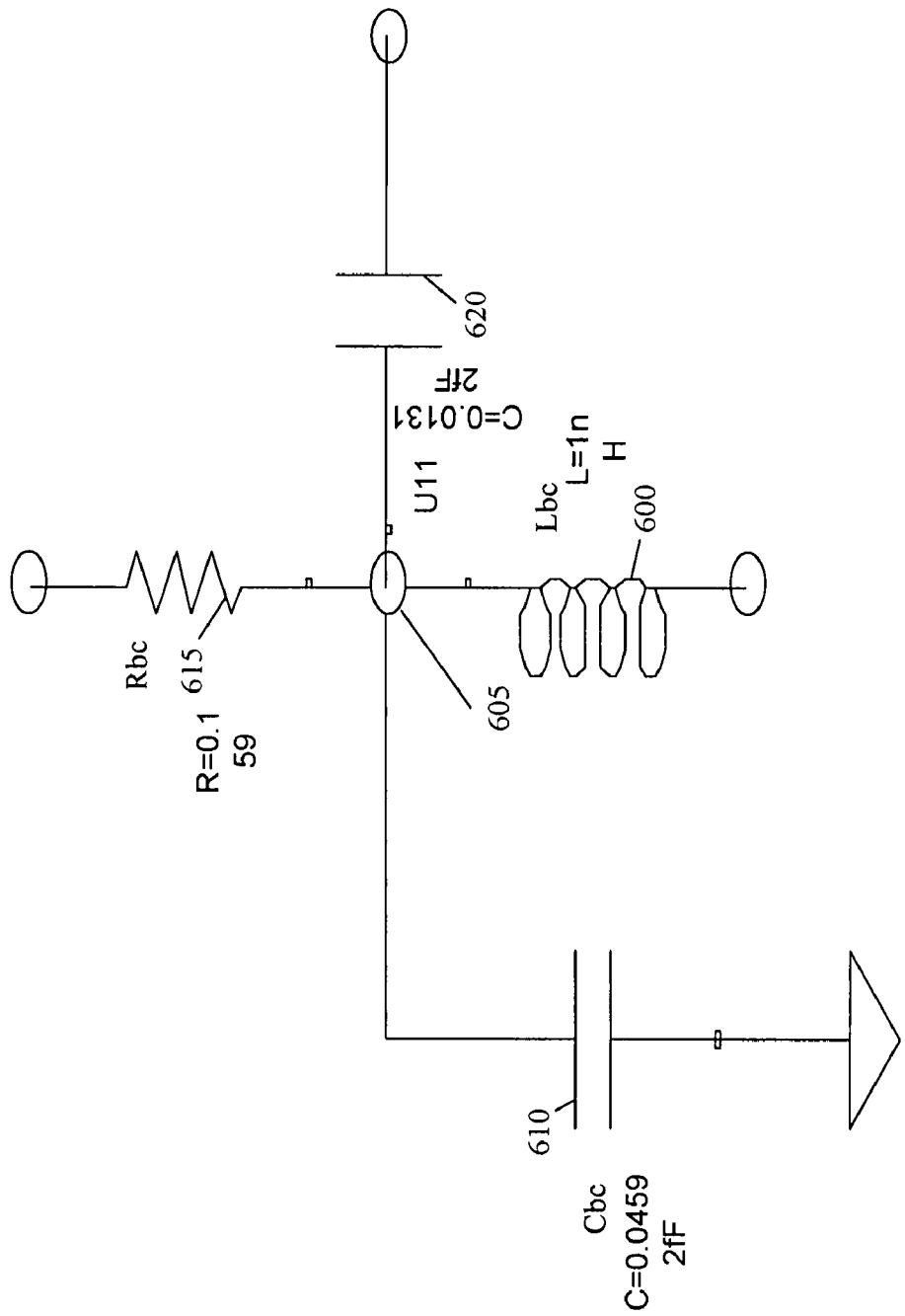
FIG. 6A illustrates an impedance model of a single bit in accordance with the present invention.
Figure 6B:
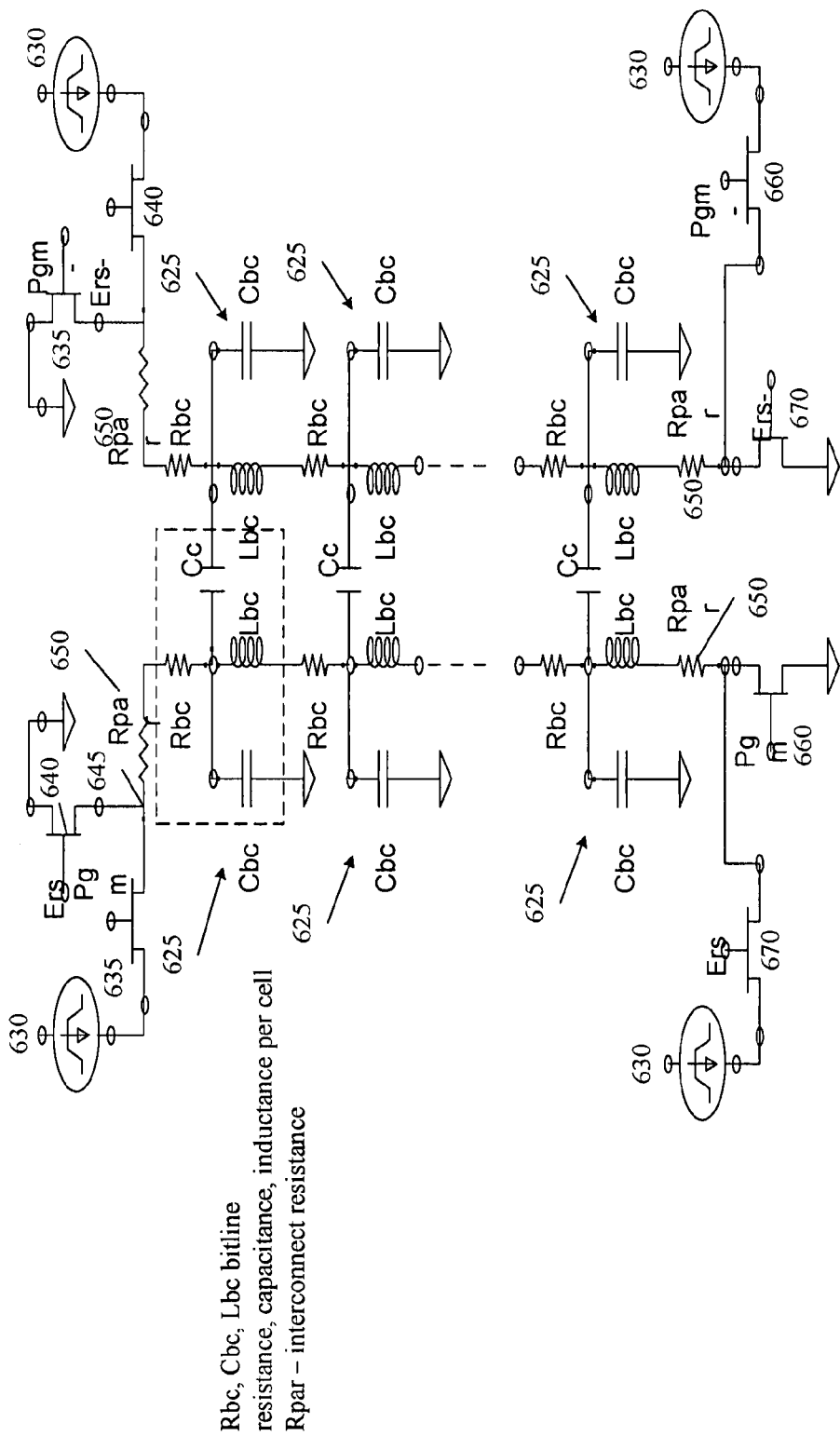
FIG. 6B illustrates in schematic form a simplified representation of a bitline/wordline Program/Erase circuit in accordance with an exemplary embodiment of the present invention.

In the exemplary arrangement illustrated in the diagrams, the erase process is essentially the reverse of the write process and can be better appreciated from FIG. 5C. The same row lines 505B and 505C receive drive currents of opposing polarities, and also opposite to the polarities used during the write operation (FIG. 5A). Similarly, the column lines 510B and 510C [for media bit 500A] and 510F and 510G [for media bit 500C] receive drive current of opposite polarities from those used during the write cycle. The result is to restore the respective media bits to the unprogrammed state, which is interpreted as a "0". It will be understood, however, that the assignment of a "0" or a "1" to either state is arbitrary, and is not limiting of the invention.

Figure 5D:
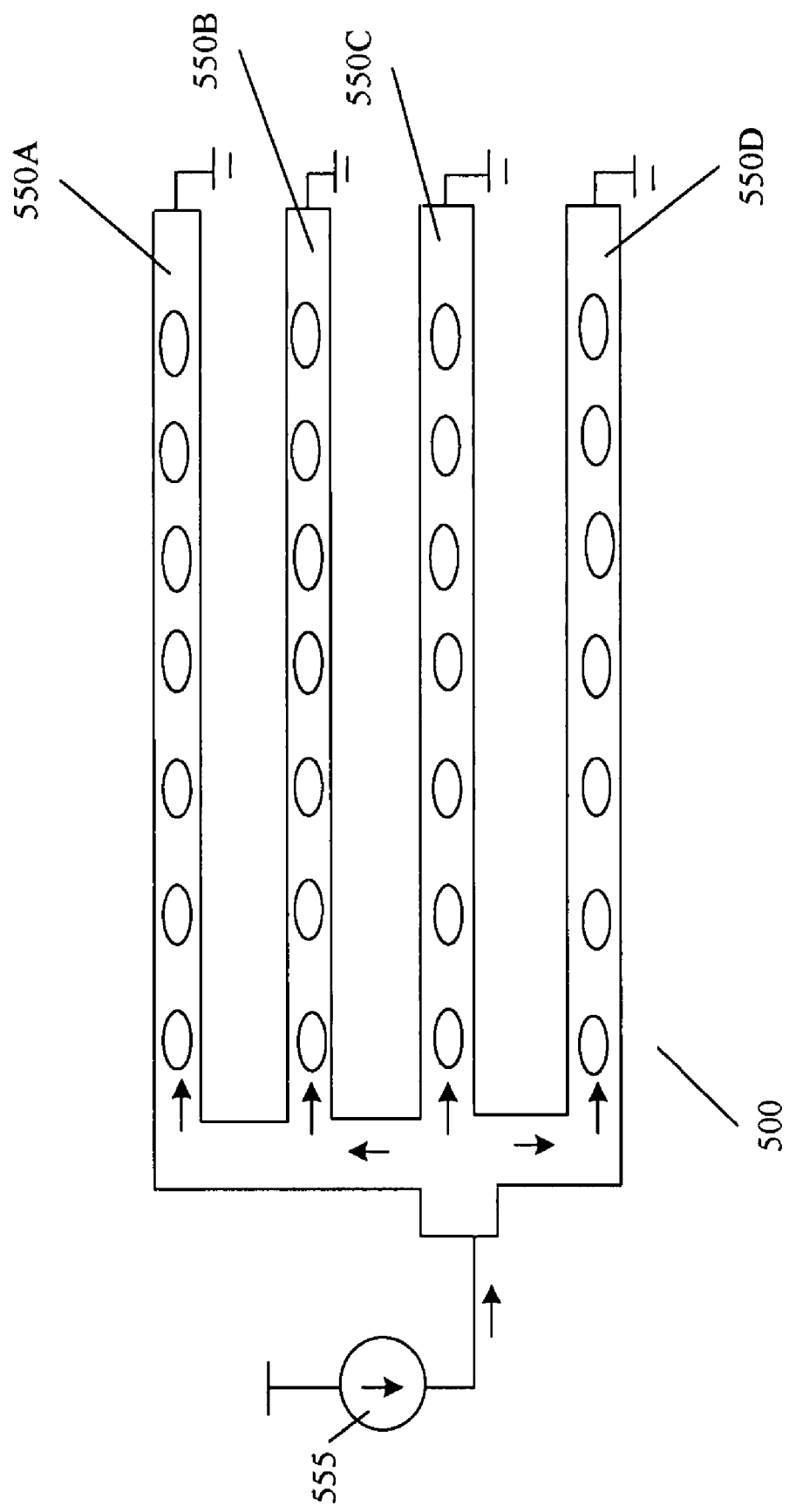

Referring next to FIG. 5D, an alternative erase scheme is depicted in schematic form, whereby blocks or sectors of media bits may be simultaneously erased. In the arrangement of FIG. 5D, a matrix array of media bits 500 is arranged in rows and columns similar to that shown in FIG. 5A. Four pairs of conducting lines 550 A-D are connected to a current source 555 and one end and to ground at the other; it will be appreciated that the choice of four rows is purely for explanation, and that actual arrays will likely use much larger sectors. In the exemplary arrangement shown, the lines are arranged substantially in a comb shape with the media bits 500 arranged between them, although the shape of the lines may vary widely with the implementation. During the erase process, the current from the source 555 splits among the pairs of lines 550 A-D as shown by the arrows 560, thus creating the desired opposing current flow. It will also be appreciated that this approach to sector erase is aided by having a separate write circuit, not shown but essentially identical to that shown in FIG. 5A. Alternatively, write operations could be performed with the circuitry of FIG. 5D by adding appropriate switches to reverse the current flow.

Referring next to FIG. 6A, which shows an impedance model for a single cell, and FIG. 6B, which shows a schematic representation of an array of cells including bit and word lines for programming and erasing, the electrical operation of an array of cells in accordance with the present invention may be better appreciated. Referring first to the single cell representation shown in FIG. 6A, a cell includes an inductor 600, indicated at $L_{bc}$, representing the magnetic media bit and connected at one end to a central node 605. Also connected to the central node 605 are a capacitance 610 which represents the capacitance between the bit and the conductor, indicated as $C_{bc}$, a resistor 615, shown as $R_{bc}$ which represents the resistance between the bit and the conductor, and a capacitance 620, represented at $C_c$, associated with the conductor itself. The capacitance $C_{bc}$ is connected at its other end to ground, while the remaining ends of the other components connect to other nodes in the array.

Referring next to FIG. 6B, the model of FIG. 6A is shown in an array with appropriate drive connections for programming and erasing. It will be apparent to those skilled in the art that the capacitance $C_c$ is shared across cells. Thus, FIG. 6B shows a 2×N array of memory cells 625, arranged in two columns and N rows, with program and erase logic at the four corners of the array. The program/erase logic at the "upper" corners of the exemplary array illustrated in FIG. 6B include a current source 630, one transistor switch 635 for connecting the current source in program mode, and another transistor switch 640 for connecting the current source in erase mode. The program and erase transistors 635 and 640 connect at a single node 645, which supplies current through a resistor 650, indicated as $R_{par}$. To achieve the desired current reversal, the positions of the program and erase transistors 635 and 640 are reversed on the right side of the illustration, relative to the left.

Similarly, the drive circuits at lower left and lower right are mirror images of one another, except that the program transistors 660 and erase transistors 670 are swapped, to allow for the desired current reversal.

Figure 7:
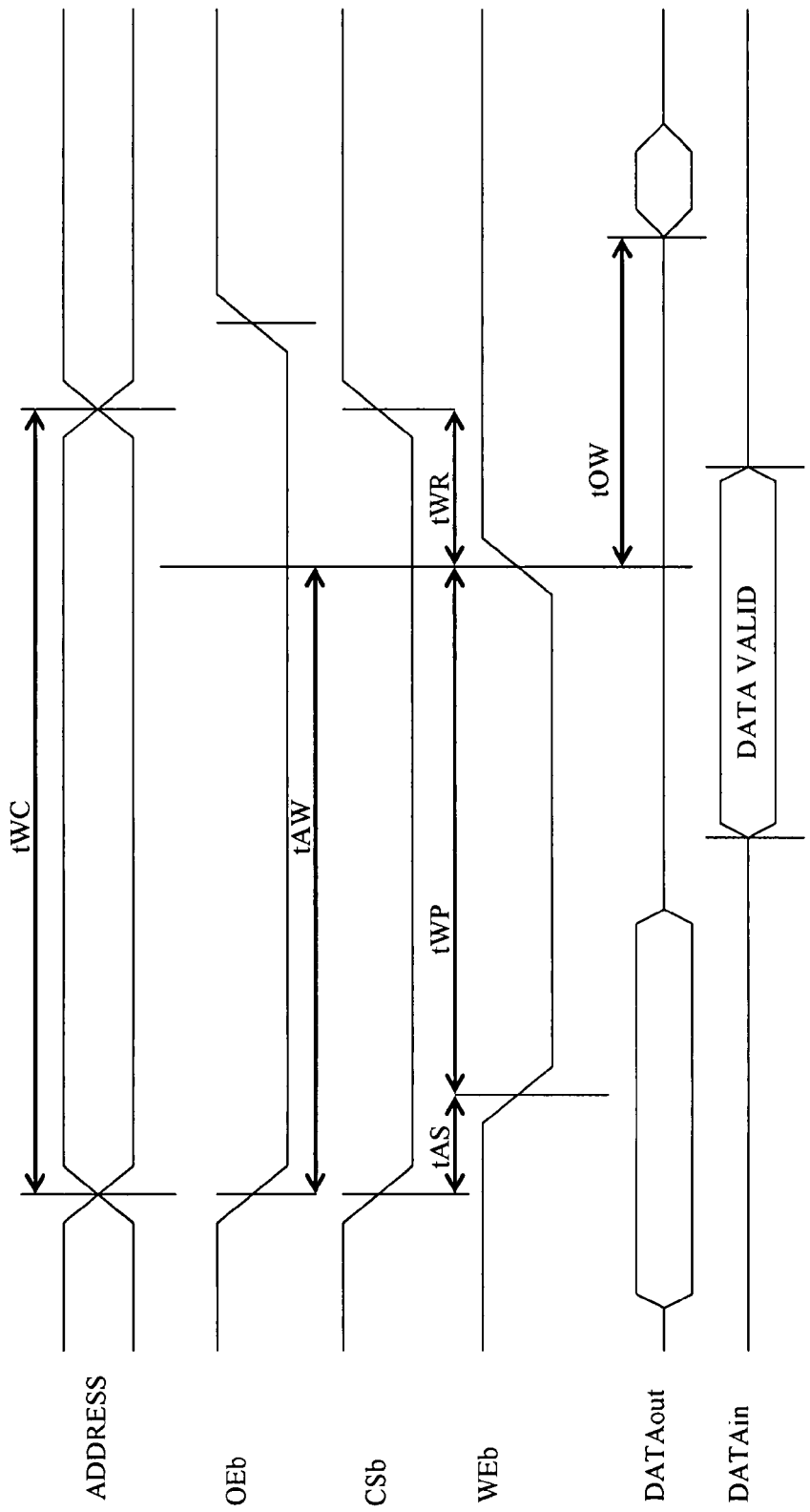
FIG. 7 is a write timing diagram for a single bit in accordance with the invention.

Referring next to FIG. 7, a timing diagram for the write function illustrates the temporal operation of the cell, including the relative timing of the ADDRESS, OEb, CSb, Web, DATAout and DATAin signals. In the exemplary arrangement illustrated, the Write cycle time, $t_{wc}$, is on the order of 20 ns, the Address Valid to end of write, $t_{AW}$, is on the order of 15 ns, while the Address Setup time, $t_{AS}$, is on the order of 0 ns. The Write pulse width, $t_{wp}$, is on the order of 15 ns, while the Write recovery time, $t_{WR}$, is on the order of 0 ns. Finally, the Output Active from end of write time, $t_{ow}$, is on the order of 3 ns.

Figure 8:
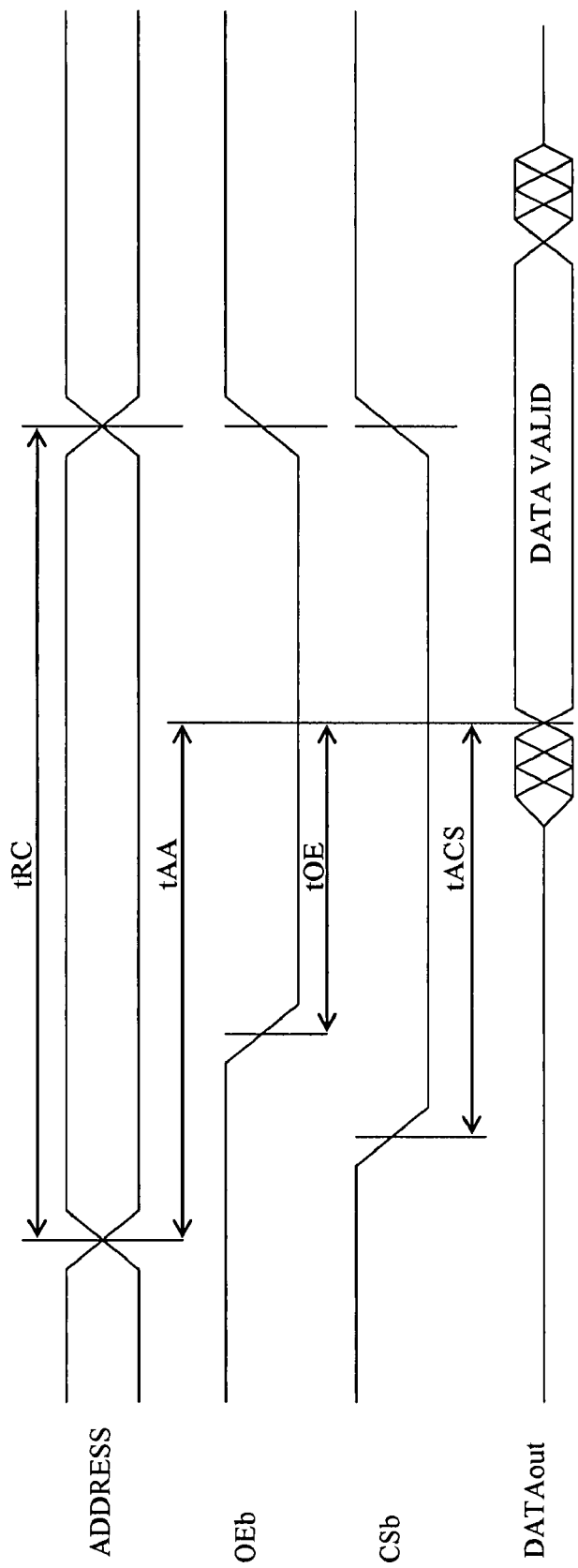
FIG. 8 is a read timing diagram for a single bit in accordance with the invention.
Figure 9A:
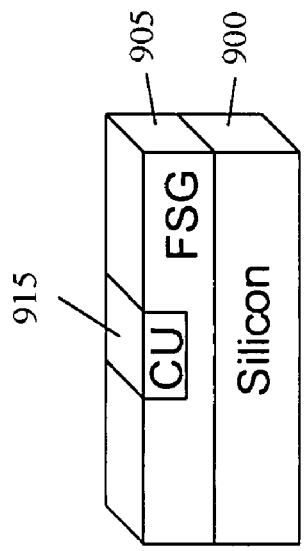
FIGS. 9A-9T are process flow steps for the fabrication of a device such as that shown in FIG. 2.
Figure 9B:
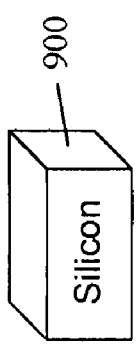
Figure 9C:
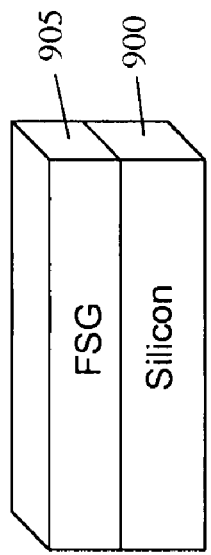
Figure 9D:
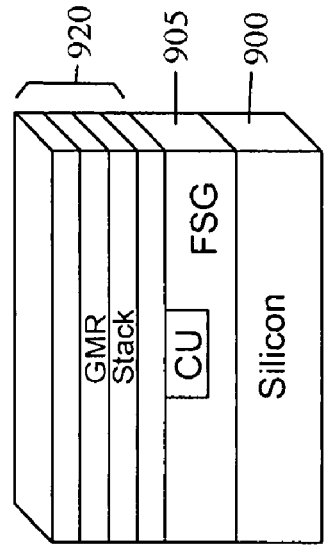
Figure 9E:
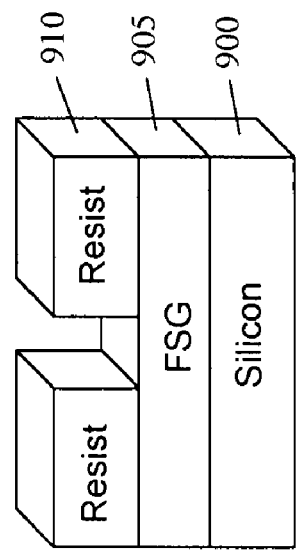
Figure 9H:
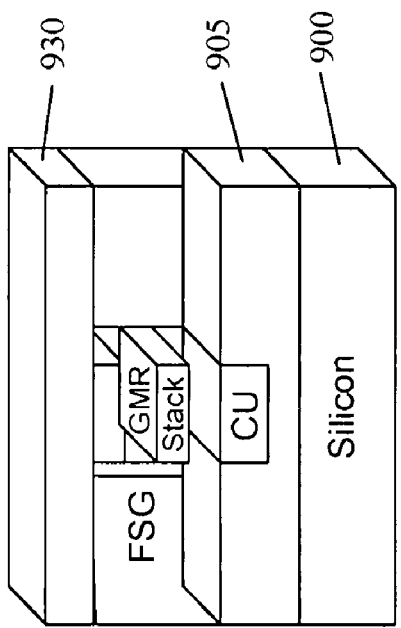
Figure 9I:
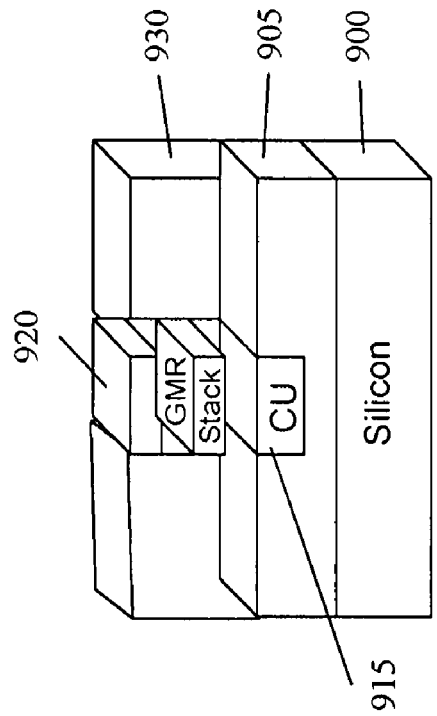
Figure 9F:
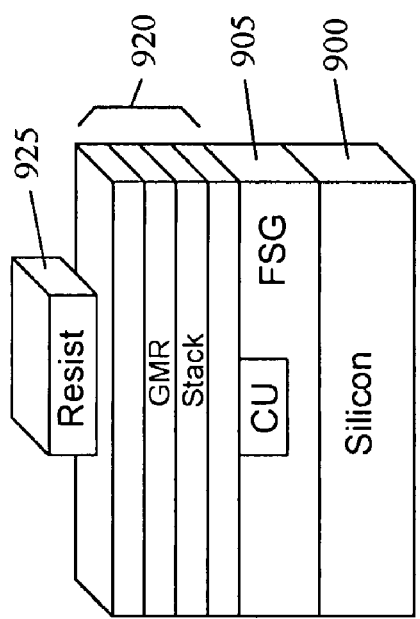
Figure 9G:
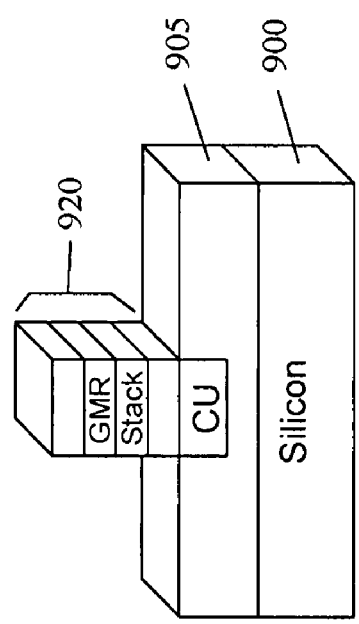
Figure 9J:
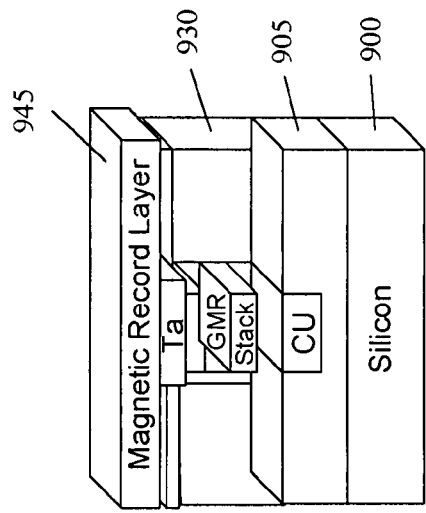
Figure 9K:
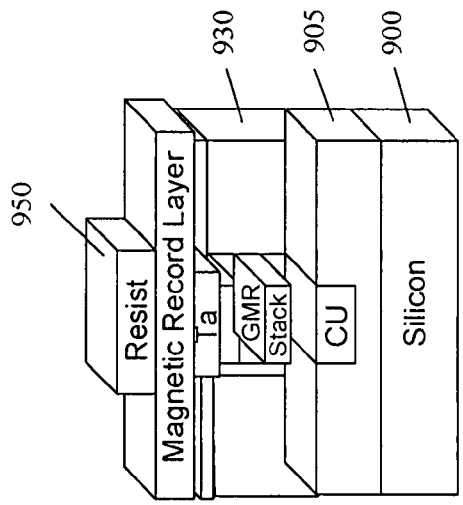
Figure 9L:
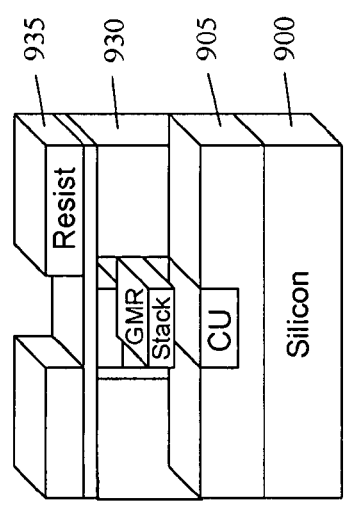
Figure 9M:
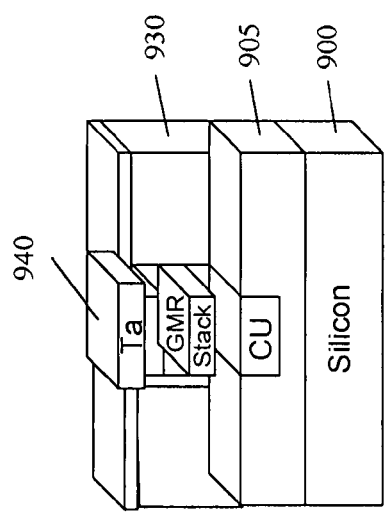
Figure 9P:
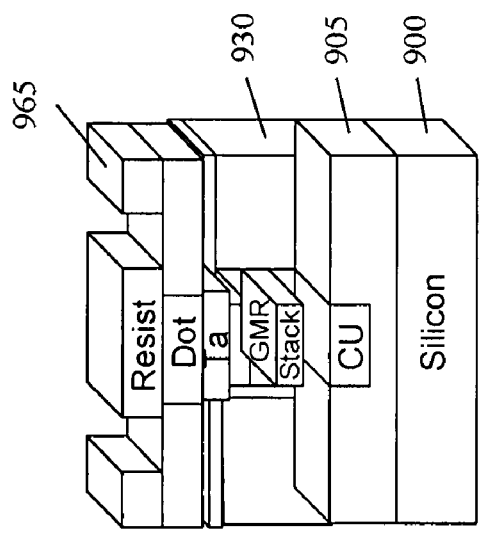
Figure 9Q:
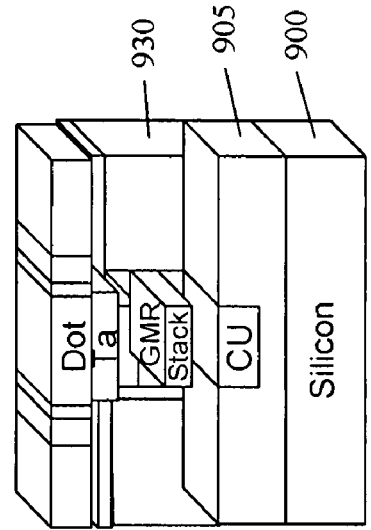
Figure 9N:
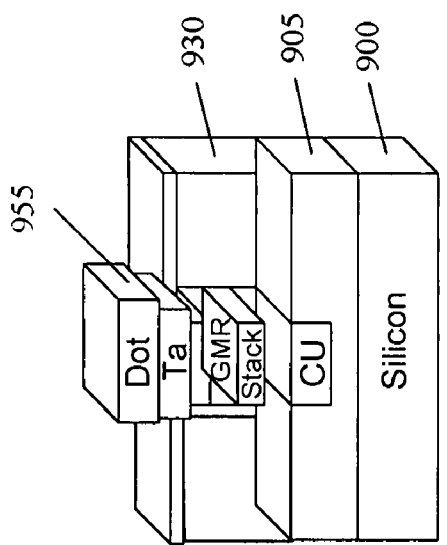
Figure 9O:
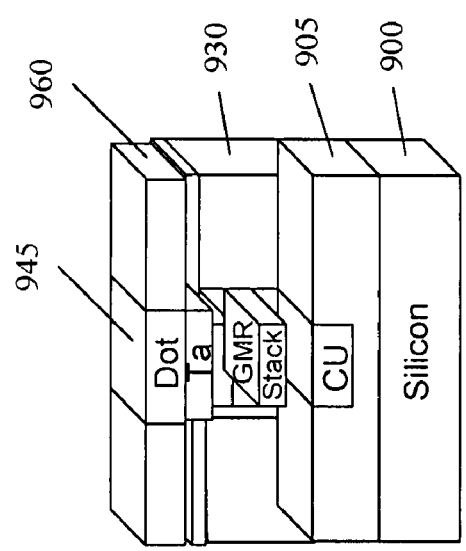
Figure 9T:
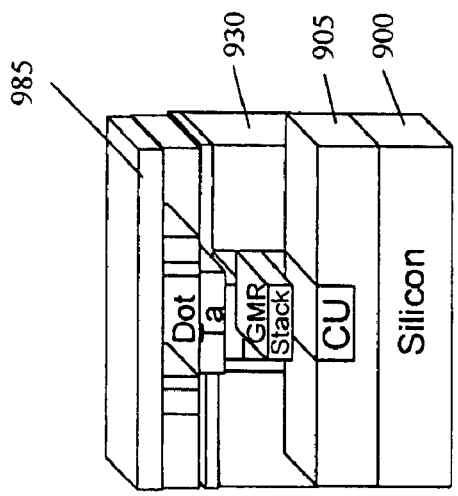

Referring next to FIG. 8, a read cycle timing diagram is shown including the comparative timing of the ADDRESS, OEb, CSb and DATAout signals. It will be appreciated that, in the structure of FIG. 2, the read process is performed using the GMR stack, as opposed to the addressing lines shown in FIG. 5A, for example. For the structure of FIG. 2, an exemplary timing diagram might have values as follows:

$t_{RC}$=Read Cycle time=20 ns (max)
$t_{AA}$=Address Access time=20 ns
$t_{OE}$=Output Enable to Output Valid=8 ns
$t_{ACS}$=Chip Select Access time=20 ns Referring next to FIGS. 9A-9T, the process flow for fabricating the exemplary memory structure of FIG. 2 may be better appreciated. For purposes of FIGS. 9A-9T, it will be assumed that the appropriate drive circuitry has already been fabricated by conventional CMOS processes. At FIG. 9A, the processed wafer 900 is provided. Then, at FIG. 9B, a dielectric layer 905 is deposited on the wafer 900. In an exemplary arrangement, the layer may be on the order of 5000 Angstroms FSG dielectric. At FIG. 9C, a resist 910 is deposited by, for example, photolithography, and then removed by means of a read mask. Then, as shown in FIG. 9D, a copper barrier/seed layer 915 is deposited, with a dielectric etch, and ECP (electrochemical plating) and CMP (chemical mechanical polishing) steps.

In FIG. 9E, a GMR spin valve stack, or, in the alternative, a GMR magnetic tunnel junction stack, 920 is deposited above the copper barrier/seed layer 915 but across a wider portion of the dielectric layer than required. A resist layer 925 is deposited by photolithography, for example a 193 nm process, as shown in FIG. 9F. The excess portions of the GMR stack are then removed by means of RIE (reactive ion etching) and Ash, as shown in FIG. 9G. Gaps are filled by the deposit of a thick FSG (fluoro silicate glass) dielectric 930, for example on the order of 2000 Angstroms, as shown in FIG. 9H, including covering the GMR stack.

Next, as shown in FIG. 9I, the dielectric is removed through CMP, to uncover the GMR stack while leaving a uniform surface for the next processing step. Then, as shown in FIG. 9J, a resist layer 935 is laid down by photolithography. Following a dielectric etch, ash, and wet clean, as shown in FIG. 9K, a layer of tantalum 940 is deposited atop the resulting stack. As shown in FIG. 9L, the magnetic media layer 945 is next deposited above the tantalum layer 940. Next, as shown in FIG. 9M, a resist layer 950 is deposited above the tantalum layer and GMR stack. Using the resist as a guide, the remainder of the magnetic layer is removed by RIE and Ash, leaving from the magnetic layer 945 only a magnetic dot 955 aligned above the tantalum layer 940. Then, as shown at FIG. 9O, a dielectric layer 960 is deposited, for example a 1000 Angstrom FSG dielectric deposited by SACVD (sub-atmospheric chemical vapor deposition), for gapfill.

Figure 9R:
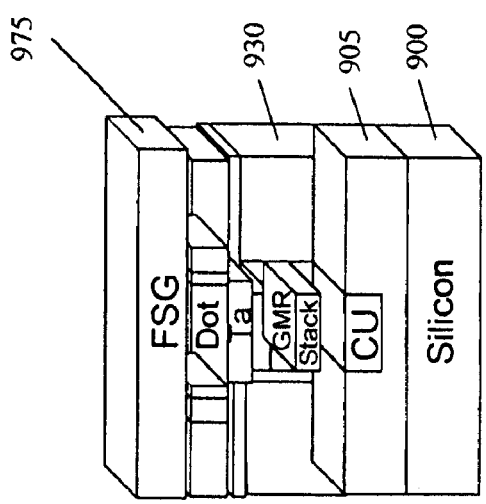
Figure 9S:
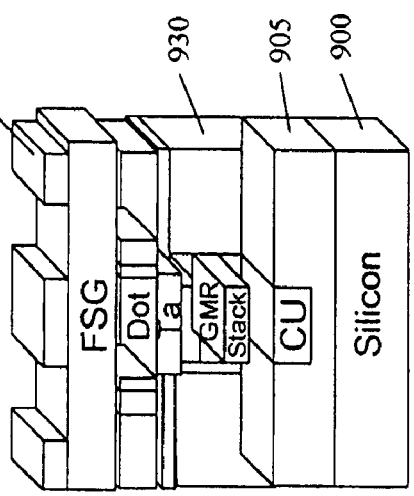

At the next step, shown in FIG. 9P, another resist layer 965 is deposited by photolithography with a mask for first layer metal. As shown in FIG. 9Q, a first set of address lines 970 are placed on either side of the magnetic dot 955 by means of a dielectric etch, deposit of the copper barrier/seed layer, and then ECP and CMP. Another FSG dielectric layer 975 is then deposited as shown in FIG. 9R, and may for example be on the order of 2000 Angstroms thick. Then, as shown in FIG. 9S, another resist layer 980 is used with a mask to prepare to form the second metal layer. Then, the remaining address lines 985 are connected by means of a dielectric etch, deposit of the copper layer, then ECP and CMP. The result is the cell structure shown in FIG. 2.

As previously noted, the GMR stack used with the present invention can be comprised of either a Spin valve or a magnetic tunnel junction. An example of a suitable spin valve structure is shown in FIG. 10, while an example of a tunnel junction suitable for use with the remainder of the invention is shown in FIG. 11. Referring first to FIG. 10, a suitable spin valve structure typically includes two ferrogmagnetic layers 1010 and 1015 disposed on either side of a conductive layer 1020, disposed above a substrate 1000. The conductive layer may, for example, be comprised of Cobalt/Copper/Cobalt. In some implementations, an additional anti-ferromagnetic layer 1025, for example PtMn, may be provided to pin the orientation of the magnetic layers. In this design, current flows in the plane of the device.

Referring to FIG. 11, an example of a magnetic tunnel junction device is illustrated. One notable different between the spin valve and the magnetic tunnel junction is that current flows perpendicular to the plane of the device. Like the spin valve of FIG. 10, the tunnel junction device disposes above a substrate 1100 two ferromagnetic layers 1110 and 1115 on either side of a tunneling barrier layer 1120. The barrier layer 1120 serves as a magnetic insulating layer. A permalloy layer 1125 may be disposed above the ferromagnetic layer 1115, with another ferromagnetic layer 1130 above that and an antiferromagnetic exchange layer 1135 disposed atop that. It will be appreciated by those skilled in the art that the basic structure of either a spin valve or a magnetic tunnel junction is a sandwich of a free layer which serves as the sensing layer, a nonmagnetic spacer, and a pinned layer, with an exchange layer of antiferromagnetic material, for example iron and manganese, to fix the magnetic orientation of the pinned layer. The magnetic orientation of the free layer is free to rotate in response to the orientation of the media bit, while the orientation of the pinned layer is fixed, thus allowing a determinable difference in orientation between the free layer and the pinned layer, depending on the orientation of the media bit.

Having fully described a preferred embodiment of the invention and various alternatives, those skilled in the art will recognize, given the teachings herein, that numerous alternatives and equivalents exist which do not depart from the invention. It is therefore intended that the invention not be limited by the foregoing description, but only by the appended claims.

We claim:

1. A solid state magnetic memory system comprising:
   a substrate having therein drive electronics;
   a magnetic media bit disposed above the substrate;
   a magnetoresistive read element disposed between the magnetic media bit and the substrate;
   at least one pair of write lines disposed one on either side of the magnetic media bit, the write lines receiving program signals to cause a state of the magnetic media bit to change; and
   conducting lines connecting the drive electronics in the substrate to the magnetoresistive read element.

2. The solid state magnetic memory system of claim 1 wherein the substrate is formed using CMOS processing.

3. The solid state magnetic memory system of claim 1 wherein the magnetoresistive read element comprises a magnetoresistive stack.

4. The solid state magnetic memory system of claim 1 wherein the magnetoresistive read element comprises a giant magnetoresistive stack.

5. A solid state magnetic memory system comprising:
   a substrate having fabricated therein drive electronics;
   an array of magnetic media cells disposed on the substrate, each magnetic media cell comprising a magnetic media bit disposed above the substrate, and a magnetoresistive read element disposed between the magnetic media bit and the substrate;
   at least one pair of write lines disposed one on either side of the magnetic media bit in at least most of the magnetic media cells;
   at least one current source connected to the write lines for changing the state of the magnetic media bit of at least some of the magnetic media cells; and
   conductive links forming a connection between the magnetic media cells and the drive electronics.

6. The solid state magnetic memory system of claim 5 wherein the magnetoresistive read element comprises a magnetoresistive stack.

7. The solid state magnetic memory system of claim 5 wherein the magnetoresistive read element comprises a giant magnetoresistive stack.

8. The solid state magnetic memory system of claim 5 wherein the drive electronics are formed by CMOS processing, and the array is formed thereover and integrated therewith.

9. The solid state magnetic memory system of claim 5 wherein the write lines are configured to allow sector erase.

10. The solid state magnetic memory system of claim 5 wherein the write lines include a first pair of write lines for programming selected cells in the array, and a second pair of write lines for erasing selected cells in the array.

11. The solid state magnetic memory system of claim 6 wherein the magnetoresistive stack is a giant magnetoresistive stack.

12. A method of fabricating a solid state magnetic memory device comprising:
   fabricating, in a substrate by the use of CMOS processing, drive electronics;
   depositing on the substrate in alignment with the drive electronics a magnetoresistive stack;
   depositing, above the magnetoresistive stack, a magnetic media bit having first and second states, the state of the magnetic media bit being configured to be sensed by the magnetoresistive stack; and
   providing at least one pair of write lines disposed one on either side of the magnetic media bit, the writs lines receiving program signals to cause the state of the magnetic media bit to change.

13. A solid state magnetic memory system comprising:
   a substrate;
   a magnetic media bit disposed above the substrate;
   a magnetoresistive read element disposed between the magnetic media bit and the substrate;
   a bit addressing line juxtaposed adjacent the media bit;
   a word addressing line substantially adjacent the media bit, the bit addressing line and the word addressing line configured to receive program signals to cause a state of the magnetic bit to change; and
   conducting lines in the substrate connected to the magnetoresistive read element arranged such that the magnetic media bit is not in a conductive path with any of the lines.

* * * * *

UNITED STATES PATENT AND TRADEMARK OFFICE
CERTIFICATE OF CORRECTION

| | |
|---|---|
| PATENT NO. | : 7,394,683 B2 |
| APPLICATION NO. | : 10/985472 |
| DATED | : July 1, 2008 |
| INVENTOR(S) | : Santosh Kumar et al. |

It is certified that error appears in the above-identified patent and that said Letters Patent is hereby corrected as shown below:

Title page,
Item [60], delete the Related U.S. Application Data, and substitute the following:

--Provisional application No. 60/518,098, filed on Nov. 10, 2003.--

Signed and Sealed this
Second Day of July, 2013

Teresa Stanek Rea
*Acting Director of the United States Patent and Trademark Office*